(12) United States Patent
Burke et al.

(10) Patent No.: US 10,314,215 B2
(45) Date of Patent: Jun. 4, 2019

(54) ELECTRICAL SHIELDING MATERIAL COMPOSED OF METALLIZED STAINLESS STEEL MONOFILAMENT YARN

(71) Applicant: MicroMetal Technologies, Inc., Newburyport, MA (US)

(72) Inventors: Thomas F. Burke, Wayland, MA (US); James E. Haller, Haverhill, MA (US)

(73) Assignee: MICROMETAL TECHNOLOGIES, INC., Newburyport, MA (US)

( * ) Notice: Subject to any disclaimer, the term of this patent is extended or adjusted under 35 U.S.C. 154(b) by 1066 days.

(21) Appl. No.: 14/229,039

(22) Filed: Mar. 28, 2014

(65) Prior Publication Data

US 2014/0202757 A1 Jul. 24, 2014

Related U.S. Application Data

(60) Continuation of application No. 13/523,049, filed on Jun. 14, 2012, now Pat. No. 8,722,186, which is a
(Continued)

(51) Int. Cl.
*H05K 9/00* (2006.01)
*C23C 18/54* (2006.01)
(Continued)

(52) U.S. Cl.
CPC ........... *H05K 9/0088* (2013.01); *C23C 18/54* (2013.01); *D02G 3/12* (2013.01); *D02G 3/441* (2013.01);
(Continued)

(58) Field of Classification Search
CPC ...... D02G 3/12; D02G 3/441; Y10S 428/935; Y10T 428/12431; Y10T 428/2942;
(Continued)

(56) References Cited

U.S. PATENT DOCUMENTS 2,317,350 A * 4/1943 Adler .................. C25D 7/0614
128/204.22
3,379,000 A 4/1968 Webber et al.
(Continued)

FOREIGN PATENT DOCUMENTS

EP      0 269 850     6/1988
EP      1593491     3/2012
(Continued)

OTHER PUBLICATIONS

Mandich, Ned; "Cyanide Copper Plating Reinvents Itself"; Mar. 2005; www.metalfinishing.com.*
(Continued)

*Primary Examiner* — Jennifer A Steele
(74) *Attorney, Agent, or Firm* — Preti Flaherty Beliveau & Pachios LLP (57) ABSTRACT

A yarn or multi-fiber formed of a plurality of micron diameter stainless steel monofilaments which have been rendered more conductive by one or more coatings of electrolytically-deposited metal or metal alloy materials. The metallized yarn provided by the invention has a very low electrical resistance, with consequent benefit in electrical performance, and is particularly useful as an RFI/EMI shielding material.

34 Claims, 2 Drawing Sheets

Related U.S. Application Data division of application No. 13/053,619, filed on Mar. 22, 2011, now abandoned, which is a continuation of application No. 12/218,231, filed on Jul. 11, 2008, now Pat. No. 7,923,390.

(60) Provisional application No. 60/959,673, filed on Jul. 16, 2007.

(51) Int. Cl.
| | | |
|---|---|---|
| *H01B 13/22* | (2006.01) | |
| *D02G 3/44* | (2006.01) | |
| *D02G 3/12* | (2006.01) | |
| *H01B 11/10* | (2006.01) | |

(52) U.S. Cl.
CPC ........ *H01B 13/225* (2013.01); *H01B 11/1033* (2013.01); *Y10S 428/935* (2013.01); *Y10T 428/12431* (2015.01); *Y10T 428/12438* (2015.01); *Y10T 428/2933* (2015.01); *Y10T 428/2938* (2015.01); *Y10T 428/2942* (2015.01); *Y10T 428/2944* (2015.01); *Y10T 428/2951* (2015.01); *Y10T 428/2958* (2015.01); *Y10T 442/339* (2015.04); *Y10T 442/3382* (2015.04); *Y10T 442/3407* (2015.04); *Y10T 442/655* (2015.04)

(58) Field of Classification Search
CPC ........ Y10T 428/2944; Y10T 428/2951; Y10T 428/2958; Y10T 442/3382; Y10T 442/339; Y10T 442/3407; Y10T 442/655; H01B 13/225; H05K 9/0088; C23C 18/00
See application file for complete search history.

(56) References Cited

U.S. PATENT DOCUMENTS

| | | | |
|---|---|---|---|
| 3,582,445 A | | 6/1971 | Okuhashi |
| 3,708,405 A | | 1/1973 | Kamata |
| 3,919,069 A | * | 11/1975 | Ascher ................. C25D 7/0607 204/206 |
| 3,967,010 A | | 6/1976 | Maekawa |
| 4,169,426 A | | 10/1979 | Kornmann et al. |
| 4,388,370 A | | 6/1983 | Ellis et al. |
| 4,537,808 A | | 8/1985 | Yamamoto et al. |
| 4,784,899 A | | 11/1988 | Ono et al. |
| 5,051,317 A | | 9/1991 | Solidum |
| 5,103,067 A | | 4/1992 | Aldissi |
| 5,139,850 A | | 8/1992 | Clarke et al. |
| 5,188,813 A | | 2/1993 | Fairey et al. |
| 5,244,748 A | | 9/1993 | Weeks, Jr. et al. |
| 5,287,690 A | | 2/1994 | Toon |
| 5,475,185 A | | 12/1995 | Tokarsky |
| 5,740,006 A | | 4/1998 | Larkin |
| 5,792,713 A | | 8/1998 | Scari et al. |
| 5,935,706 A | | 8/1999 | Hoover et al. |
| 6,045,680 A | * | 4/2000 | Cawston ............. C23C 18/1644 205/138 |
| 6,112,395 A | | 9/2000 | Quick et al. |
| 6,697,248 B1 | | 2/2004 | Luch |
| 6,957,525 B2 | | 10/2005 | Verstraeten et al. |
| 7,291,391 B2 | | 11/2007 | Watson |
| 7,732,038 B2 | | 6/2010 | Naito et al. |
| 2002/0007546 A1 | | 1/2002 | Quick et al. |
| 2003/0089432 A1 | * | 5/2003 | Carey, II ............. B23K 35/262 148/527 |
| 2003/0224111 A1 | | 12/2003 | Suganuma et al. |
| 2005/0282009 A1 | | 12/2005 | Nusko |
| 2006/0057415 A1 | * | 3/2006 | Watson .................. D02G 3/12 428/605 |
| 2007/0031621 A1 | | 2/2007 | Morimoto et al. |
| 2007/0089899 A1 | | 4/2007 | Roberts et al. |

FOREIGN PATENT DOCUMENTS

| | | |
|---|---|---|
| JP | 53101687 | 2/1977 |
| WO | 2006/128633 A1 | 12/2006 |

OTHER PUBLICATIONS

"Cleaning and descaling stainless steel", American Iron and Steel Institute, distributed by Nickel Development Institute, published 1982, reprinted 1988 (Year: 1988).*

"Corrosion Resistance of Austenitic Chromium-Nickel Stainless Steels in Chemical Environments" INCO International Nickel Company, copyright 1963 (Year: 1963).*

Chemical Compatibility Guide, Graco, Jul. 2, 2013 (Year: 2013).*

Paul T. Vianco, General Soldering, copyright 1993 ASM International, pp. 964-984.

* cited by examiner

FIG. 1

FIG. 2
PRIOR ART ic systems in aerospace applications has grown, designers of the cables that interconnect system components have been obliged to meet increasingly stringent requirements for RFI/EMI protection and, because aircraft performance and operating cost are directly related to weight, demand for lighter weight cable constructions. In conventional designs, cables are protected against RFI/EMI by wire mesh shields that are braided over the insulation that surrounds the cable core. In more demanding applications, additional shielding protection can be achieved with the use of a separately braided or knitted wire mesh sleeve that fits over one or more cables. Conventional shielding materials consist of single strand, tin-, nickel, or silver-plated copper wire, typically #34 or #36 AWG (6.3 or 5.0 mils diameter respectively).

ELECTRICAL SHIELDING MATERIAL COMPOSED OF METALLIZED STAINLESS STEEL MONOFILAMENT YARN

CROSS REFERENCE TO RELATED APPLICATIONS

This application is a continuation of U.S. Non-Provisional patent application Ser. No. 13/523,049, filed Jun. 14, 2012, entitled "Electrical Shielding Material Composed of Metallized Stainless Steel Monofilament Yarn which is a divisional of U.S. patent application Ser. No. 13/053,619, filed Mar. 22, 2011, entitled "Electrical Shielding Material Composed of Metallized Stainless Steel Monofilament Yarn" which is a continuation of U.S. patent application Ser. No. 12/218,231, filed Jul. 11, 2008, entitled "Electrical Shielding Material Composed of Metallized Stainless Steel Monofilament Yarn", now issued as U.S. Pat. No. 7,923,390 on Apr. 12, 2011 and which claims the benefit of U.S. Provisional Application No. 60/959,673, entitled "Metallized Stainless Steel Micro-Fiber and Yarn" filed Jul. 16, 2007, the contents of which are hereby incorporated by reference herein.

STATEMENT REGARDING FEDERALLY SPONSORED RESEARCH OR DEVELOPMENT

N/A

BACKGROUND OF THE INVENTION

The invention relates to yarns and multi-fibers comprised of metallized stainless steel monofilaments suitable for use as RFI/EMI shielding materials and other purposes.

As the complexity of electronic systems in aerospace applications has grown, designers of the cables that interconnect system components have been obliged to meet increasingly stringent requirements for RFI/EMI protection and, because aircraft performance and operating cost are directly related to weight, demand for lighter weight cable constructions. In conventional designs, cables are protected against RFI/EMI by wire mesh shields that are braided over the insulation that surrounds the cable core. In more demanding applications, additional shielding protection can be achieved with the use of a separately braided or knitted wire mesh sleeve that fits over one or more cables. Conventional shielding materials consist of single strand, tin-, nickel, or silver-plated copper wire, typically #34 or #36 AWG (6.3 or 5.0 mils diameter respectively).

Although functionally suitable in the past, these materials cannot satisfy the more stringent shielding and weight requirements imposed on new cable designs. Leakage occurs in shields fabricated from conventional plated copper wires due to gaps in the mesh where the wires intersect. In addition, the stiffness of the metal wire used in braiding prevents the mesh from tightly conforming to the surface of the core insulation, leaving small gaps that have the effect of limiting the frequency range over which the cable can be operationally effective. Braided wire mesh fabricated from smaller diameter wires would presumably improve shielding effectiveness as well as reduce cable weight but copper wires finer than #36 AWG are too prone to breakage in the braiding process.

DISCUSSION OF RELATED ART

One solution to these problems is proposed in U.S. Pat. No. 5,103,067 (Aldissi, Champlain Cable Corporation, Jan. 19, 1993) and related patents (U.S. Pat. Nos. 5,180,884, 5,473,113) wherein the performance and weight-reduction advantages of metal-coated polymeric fibers is described. In this approach, yarns of micron-diameter aramid monofilaments having high strength-to-weight ratio and flexibility are metallized with one or more thin layers of conductive material, then braided or knitted into a tight mesh. The high tensile strength of the aramid monofilaments provides mechanical strength in a small diameter form factor that contributes to improved shielding performance by reducing the size of the gaps in the mesh. The flexibility that the polymeric yarns impart to this braided construction also provides greater conformity to the surface of the underlying insulation, thereby expanding the frequency range over which the shielding is effective. Finally, even with its conductive coating, metallized aramid yarn weighs much less than its conventional copper wire counterpart.

Despite these attributes, the metallized aramid yarn proposed above does not completely address the needs of cable designers. The chief drawback is its cost—more than 20 times that of conventional plated wire—which effectively limits its use to selected aerospace applications such as satellites and military aircraft where the performance penalty related to excess weight is very high. The high cost of metallized aramid yarn is attributable to its necessary reliance on an electroless deposition process to form the first conductive layer on the polymeric monofilaments; electroless deposition processes are not only much slower but involve much more expensive chemistry than electrolytic processes. Furthermore, although its performance is superior to conventional materials, metallized aramid yarn is not optimal with respect to either coverage or conductivity, two factors that affect shielding effectiveness. Smaller diameter aramid monofilaments would permit braided shields to be made with smaller air gaps but constructions of metallized aramid yarn are limited to 15 micron diameter monofilaments due to the fact that smaller diameter filaments are embrittled by the amount of plated metal needed to provide sufficiently low resistance for shielding applications, typically 1 ohm/ft or less. Consequently, from a conductivity standpoint, yarns comprised of metallized aramid monofilaments have much higher resistance per unit weight properties, in the range of 22 ohms/gram, compared to about 12 ohms/gram for #36 wire or 2 ohms/gram for #34 wire. Finally, the properties of the polymeric monofilaments themselves limit the temperature and chemical exposure that metallized polymeric yarns can reliably withstand.

Accordingly, it would be desirable to employ a simpler, lower cost metallization process to provide a shielding material consisting of a conductive multi-filament yarn having a small form factor (diameter), high conductivity to weight aspect, excellent flexibility, and the ability to withstand a wide range of thermal and chemical exposure. One approach to such an objective is found in U.S. Pat. No. 7,291,391, issued to Watson et al on Nov. 6, 2007, wherein the use of an electrolytic metallization process to reduce the resistivity of yarns comprised of micron-diameter stainless steel monofilaments is proposed for use as an electrical resistance heating element for heated car seats.

However, the metallized stainless steel yarn proposed in Watson et al is not suitable for use in cable shielding applications. Its principal deficiency is that the metallized coating is not uniformly applied around the circumference of each monofilament in the yarn bundle. Indeed, as illustrated in the accompanying figures, most of the mono-filaments in the interior of the yarn bundle are not metallized at all. Although details about the metallizing process are not presented in the patent, those skilled in the art will recognize that this result is consistent with the use of conventional wire plating methods wherein single strands of wire are pulled under high tension through long plating baths. When such a process is used to plate a multi-filament yarn bundle, particularly one that is tightly twisted, the axial tension in the yarn compresses the bundle and prevents the plating solution from properly wetting the inner filaments. From a functional standpoint, therefore, the un-plated filaments would represent "dead weight" in an airborne application. Moreover, by concentrating the plating activity at the periphery of the yarn bundle, a high tension process makes it very likely that most if not all of the outer filaments will plate together, thus stiffening the yarn bundle and making it behave more like a solid strand of wire in a braided matrix. Finally, since it would be difficult to reliably remove chemicals trapped within the tightly bound yarn bundle, the use of a high tension plating method presents the risk that long-term corrosion sites will be incorporated into the material.

Military/aerospace cable applications also impose rigorous environmental tests (temperature cycling, shock/vibration, etc.) that stress the adhesion of plated metal coatings to their substrate materials (e.g., silver or tin coatings plated on copper wire). Although it is well-known that stainless steel has an oxidized or "passivated" surface that must be chemically altered or "activated" in order to achieve good adhesion to plated coatings, Watson et al does not prescribe this pre-conditioning step or, for that matter, even a rudimentary cleaning process to remove any residual lubricants or dirt from the wire drawing process itself.

Accordingly, it would be desirable to provide a highly conductive multi-filament stainless steel yarn which is completely and substantially uniformly plated with one or more metal or metal alloy layers. It would be desirable to provide a yarn of this description with improved electrical performance (lower resistance per length and weight) in a low twist format that, by allowing the monofilaments to adjust themselves within the woven matrix, would achieve high packing density and, thereby, improved shielding coverage in braided or knitted cable shielding applications. It would also be desirable to provide a high degree of adhesion between the stainless steel monofilaments and their plated metal coatings. Finally, it would be desirable to produce such highly conductive stainless yarns in a continuous roll-to-roll process.

BRIEF SUMMARY OF THE INVENTION

The invention provides a yarn or multi-fiber formed of a plurality of micron diameter stainless steel monofilaments which have been rendered more conductive by one or more coatings of metal or metal alloy materials that have been electrolytically deposited around each of the monofilaments in the yarn bundle. Although the stainless steel yarn employed in this invention is heavier than aramid yarn in terms of basis weight, the stainless steel monofilaments themselves comprise a starting yarn that is inherently conductive; consequently, only a very thin coating, typically no more than 1-2 microns, of conductive material is required to achieve the desired shielding resistance values of 1 ohm/ft or less. As a result, the resistance per unit weight of the conductive stainless steel yarn of this invention is significantly less than that of metallized aramid yarn; in fact, it is actually less than the resistance per unit weight of #36 copper wire This improved electrical performance is also achieved at much lower cost owing to the fact that the metallization process relies only upon electrolytic deposition methods which are much faster and involve chemicals which are much less expensive than those involved in electroless processes. Compared to yarns consisting of metallized polymeric monofilaments, the monofilament coatings provided by the present invention are more uniform, more adherent, and can operate without degradation over a much wider temperature range. The conductive stainless steel yarns of this invention are also comprised of smaller diameter monofilaments which impart improved flexibility and packing density to cable shields braided with these yarns.

The shielding material of this invention is a multi-filament yarn bundle comprised of micron-diameter stainless steel monofilaments which are rendered more conductive by transport through a multi-step electrolytic metallization process. An ancillary feature of this multi-step process is that the number of layers, the thicknesses of the layers, and the variety of metals or metal alloys that can be deposited in each layer cover a wide range of possibilities. Consequently, this process can be used to produce metallized stainless steel yarn constructions for applications that extend well beyond cable shielding per se.

BRIEF DESCRIPTION OF THE SEVERAL VIEWS OF THE DRAWINGS

The invention will be more fully described in the following detailed description taken in conjunction with the accompanying drawings in which.

DETAILED DESCRIPTION OF THE INVENTION

Starting material. The composition of the starting yarn bundle in terms of monofilament diameter and number of monofilaments can be varied to suit the requirements of the end-use application. For example, one application might call for a yarn configuration of 90 monofilaments, each 14 microns in diameter, while another might require as many as 275 monofilaments, each 12 microns in diameter. Depending on yarn configuration, a bobbin of starting material will typically contain several thousand meters per pound of yarn. Preferably, the monofilaments are less than about 20 microns in diameter, and the number of monofilaments in a yarn bundle is less than about 2000.

An important requirement of the starting material is that the twist imparted to the yarn bundle be no more than 2.5 turns/inch (100 turns/meter), preferably no more than 1 turn/inch (40 turns/meter); ideally, the yarn will be untwisted. The low-twist yarn construction, together with a low tension means of transport, allows the process chemistry to completely penetrate the yarn bundle and thereby effect the plating of the innermost monofilaments. The low-twist construction also allows the individual monofilaments to move with respect to each other as they are transported through the low tension metallization process; this prevents the monofilaments from plating or adhering to each other and ensures that the flexibility of the starting yarn is preserved in its fully plated state.

Figure 1:
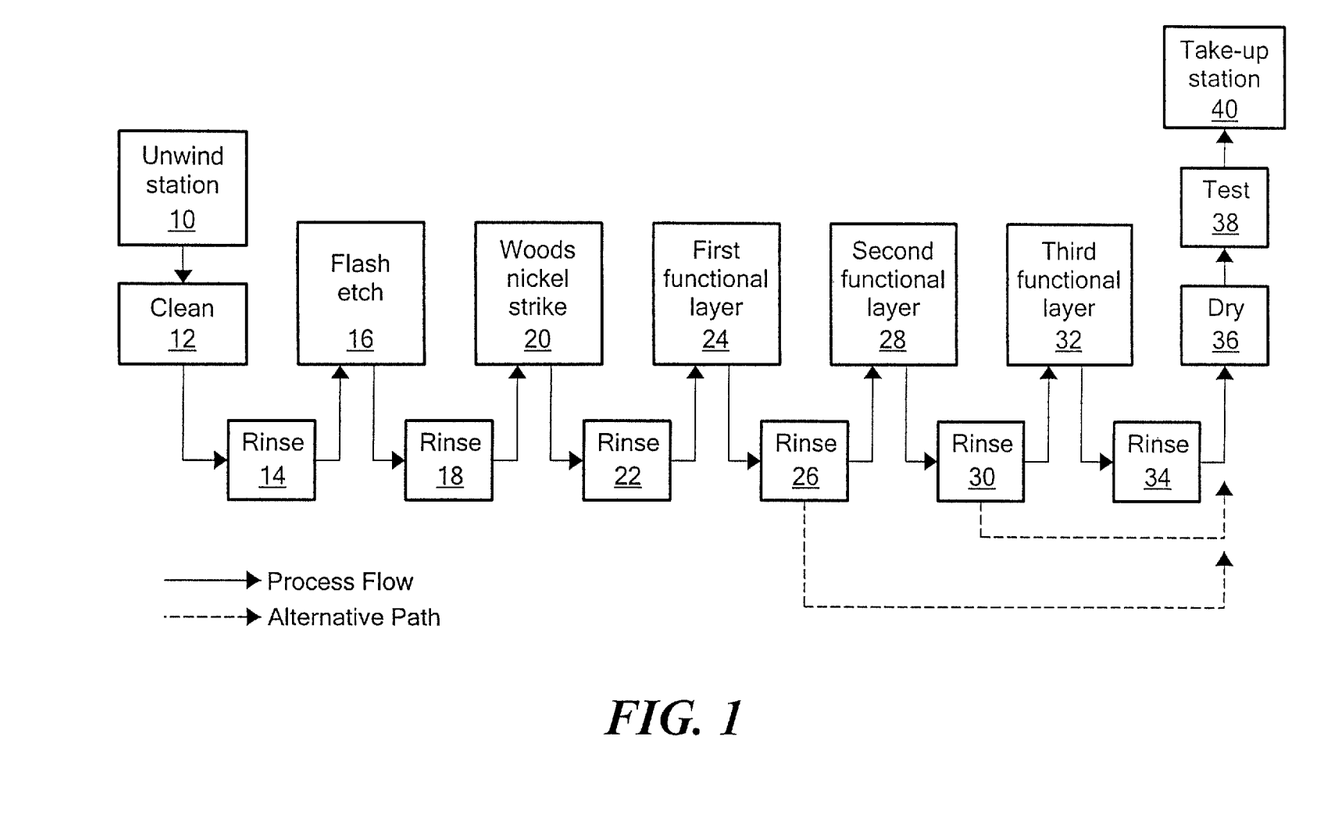
FIG. 1 is a simplified schematic of the steps involved in the yarn treatment and electroplating process.

The process is illustrated diagrammatically in FIG. 1. The yarn is transported through successive baths to accomplish the steps of the process. The yarn composed of the monofilaments is transported from an unwind station 10 to a cleaning station 12 and thence to a rinse station 14. The yarn then proceeds to a flash etch station 16 after which the yarn is transported to a rinse station 18 and thence to a Woods nickel strike station 20. The yarn is then transported to another rinse station 22 and then to a first functional layer electroplating station 24. The yarn is next transported to another rinse station 26 and then to a second functional layer electroplating station 28. The yarn is next transported to a rinse station 30 and to a third functional layer electroplating station 32. The yarn is transported from the electroplating station 32 to a rinse station 34 and then to a drying station 36. After drying, the yarn is transported to a test station 38 and finally to a take-up station 40.

The speed of transport of the yarn through the process stations and the amount of time that the yarn remains at each station can vary depending upon the concentration of the bath solutions and the desired plating thicknesses to be applied.

The dotted lines in FIG. 1 illustrate alternative process paths for alternative embodiments of the invention. For applications that require only a single functional layer to be electroplated on the strike-plated monofilaments at station 24, the single functional layer would be a metal or metal alloy combining lower resistivity than stainless steel with inherent oxidation or corrosion resistance, such as nickel, silver, gold, palladium, platinum, rhodium, and the like.

In another alternative embodiment, a first functional layer is electroplated onto the strike-plated monofilaments at station 24, and a second functional layer is electroplated at station 28 onto the previously electroplated first functional layer. After electroplating of the second functional layer, the yarn is rinsed at station 30 and then sequentially transported to the drying, test and take-up stations.

It will be appreciated that the invention can be practiced in a variety of embodiments to suit particular specifications and applications wherein one or more metals or metal alloys are successively applied to the activated monofilaments.

Unwind station. The bobbins of starting material are mounted on spindles which dispense the yarn into the process under control of a braking device that regulates the back tension on the yarn bundle.

Step 1. Clean and rinse. The first step in the process involves the removal of any oils or other organic contaminants that remain on the monofilament surfaces at the completion of the wire drawing process itself. There is a wide range of commercially available cleaning solutions that can be employed in this step which is followed by a series of de-ionized (DI) water rinses.

Step 2. Flash etch and rinse. As is well-known to those skilled in the art, it is virtually impossible to achieve high levels of plating adhesion to stainless steel surfaces that have not been properly "activated" by the removal of surface oxides. There are a variety of commercially available hydrochloric acid or sulfuric acid formulations suitable for this step. This step is followed by a DI water rinse.

Step 3. Woods nickel strike and rinse. The activated monofilaments are then transported into a so-called Woods nickel bath where a strike layer of nickel less than about 1000 Angstroms thick and preferably approximately 200-300 Angstroms thick is electrolytically deposited on the monofilament surfaces. Woods nickel plating solutions are well-known to those skilled in the art and are typically formulated with relatively high concentrations of HCL which, by virtue of etching the surface of the stainless steel as the nickel is electrolytically deposited, promotes the formation of a strong bond between this first metal coating and the stainless steel substrate. This adhesion-promoting layer is essential in a plating sequence such as the one illustrated here wherein the next step is a conventional acid copper plating process. Without this strike layer, the copper will immersion-plate onto the stainless surfaces with very low adhesion. Immersion plating of copper is less likely to occur with alternative (but not widely-practiced) copper plating processes, namely cyanide-copper or pyrophosphate-copper solutions, and thus a Woods nickel strike layer may not be required in all metallization schemes involving stainless steel. Nevertheless, the widespread use of this adhesion-promoting process suggests that those skilled in the art consider it to be "standard practice". This step is followed by a thorough DI water rinsing of the yarn.

Step 4. First functional layer and rinse. To improve the conductivity of the yarn bundle with as little additional metal weight as possible, it is preferred to electrolytically deposit a highly conductive metal such as copper or silver in the next step. However, in applications where conductivity or weight is not a primary concern, this first functional layer can be comprised of any other metal or metal alloy that can be electroplated in an aqueous solution, for example: brass; tin; zinc; nickel; gold; platinum; palladium; rhodium; cadmium; chromium; Permalloy (a nickel/iron alloy); and so forth. To ensure complete and uniform plating of the monofilaments, the plating solution is continuously circulated and vigorously agitated by virtue of a pumping system that discharges the solution into the plating tank through nozzles (so-called "spargers") arrayed across the bottom of the tank. This step is followed by a thorough rinsing of the yarn. When the metal layer deposited in this step is the final layer, as in the case of a noble metal layer for example, the yarn is then dried with air knives and wound on a bobbin.

Step 5. Second functional layer and rinse. If the stainless steel yarn is plated with copper in the previous step, the exposed copper surfaces must be protected against oxidation and corrosion. Accordingly, the functional layer formed in this step would preferably be drawn from a list of metals or metal alloys compatible with copper and known to provide good resistance to oxidation and corrosion, among them: nickel, tin, chromium, and the noble metals, as well as alloys such as tin/lead or tin/silver. The plating solution in this step is likewise circulated and agitated by means of a sparging system. This step is followed by a thorough rinsing of the yarn. When the metal layer deposited in this step is the final layer, as in the case of a nickel layer for example, the yarn is then dried and wound on a bobbin.

Step 6. Third functional layer and rinse. If the yarn metallization consists of a first layer selected for conductivity (copper) and a second layer selected for protection (nickel), a third functional layer is required if the application also requires soldering because nickel does not provide a readily solderable surface. In this case, the functional layer formed in this step would preferably be drawn from a list of metals or metal alloys known to form strong bonds with solderable metals, among them silver, tin, tin/lead, and gold. The plating solution in this step is likewise circulated and agitated by means of a sparging system. This step is followed by a thorough rinsing of the yarn. When the metal layer deposited in this step is the final layer, as in the case of a silver layer for example, the yarn is then dried and wound on a bobbin.

Take-up station. The process line is configured in such a way that, after the completion of any functional step, the yarn can be diverted to the drying station where residual DI rinse water is driven off by air knives. The yarn is then wound onto bobbins at the take-up station using conventional textile winding equipment with automatic tension controls.

Yarn transport. To achieve plating of the innermost filaments in the stainless steel yarn bundle, this process relies on an unconventional means of transporting the yarn through the various process steps. As the yarn is paid off of the unwind bobbin, it is advanced through the various process steps in a serpentine fashion by passing over rotating pulleys and contact rollers which are arranged so that the unsupported length between rotating elements is short, typically no more than one foot. This arrangement, augmented by periodic tension adjustment mechanisms, ensures that the yarn bundle remains under low tension throughout the process. Another desirable feature of this transport scheme is that, as the loose yarn passes over the flat surfaces of the pulleys and contact rollers, the monofilaments spread out and allow the process chemistry to fully penetrate the yarn bundle. By the same token, this method also ensures that the rinsing steps will effectively remove all traces of process chemistry before the yarn is dried and wound up.

Subsequent processes. In a production process, the metallized stainless steel yarn would then be tested and inspected off-line for compliance with the properties specified for the end-use application. In the case of yarn intended for use in a braided cable shielding application, for example, the properties to be tested would typically include electrical resistance, plated metal weight, plated metal adhesion, and solderability. For shielding applications, the conductive yarn should have a resistance of less than about 2 ohms/ft. and a resistance/weight of less than about 15 ohms/gram. Yarn found to be of satisfactory quality would then be uptwisted and wound onto braider bobbins for shipment to cable manufacturers or suppliers of knitted tubing.

DESCRIPTION OF THE PREFERRED EMBODIMENT

Figure 2:
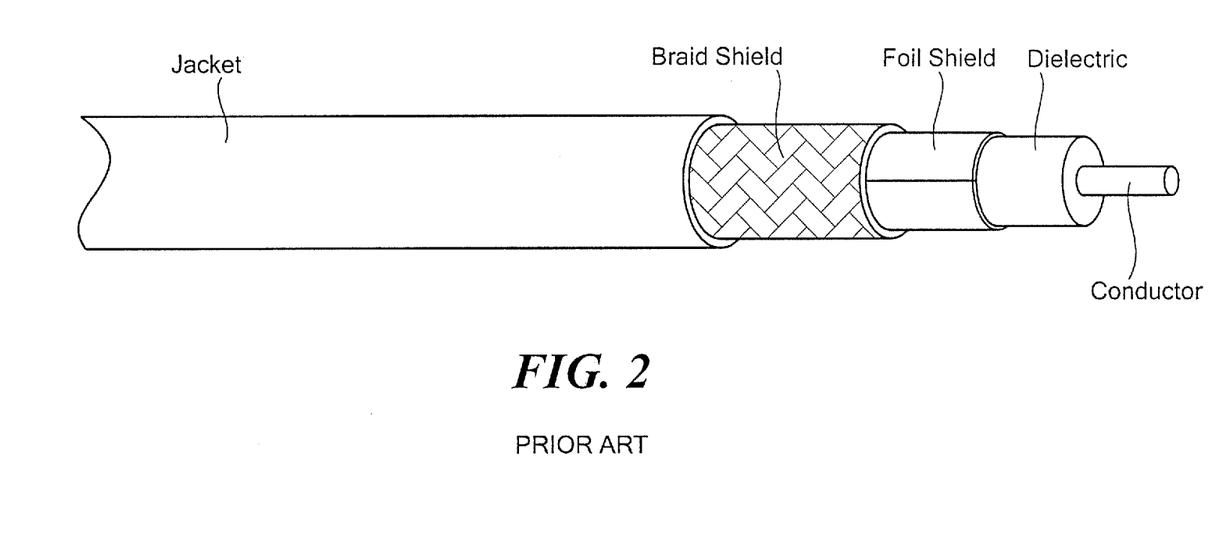
FIG. 2 is a cut-away drawing showing a braided shield in a typical coaxial cable construction.

Given the impracticality of detailing preferred process conditions for all possible yarn and metallization constructions, the following will serve to illustrate a preferred process for metallizing a yarn suitable for use in a cable shielding application requiring solderability. A typical coaxial cable having a braided shield is shown in FIG. 2.

Starting material. In this example, a preferred starting yarn construction consists of 275 stainless steel monofilaments each 12 microns in diameter in an untwisted format. An alternative preferred starting yarn construction consists of 90 stainless steel monofilaments each 14 microns in diameter in a twisted format of no more than 1 turn/inch (40 turns/meter).

Step 1. Clean and rinse. The starting yarn is conveyed through an ultrasonically agitated solution of MacDermid's New Dimensions Supreme followed by a DI water rinse.

Step 2. Flash etch and rinse. The yarn is next conveyed through an acid cleaner, Metex M-639 from MacDermid, in a cathodic electro-cleaning setup, followed by a DI water rinse.

Step 3. Woods nickel strike and rinse. The yarn is next conveyed through a bath consisting of 66% by volume nickel chloride concentrate (732 g/l nickel chloride hexahydrate), 5% by volume HCL, balance de-ionized water. This step is followed by a DI water rinse.

Step 4. First functional layer and rinse. The yarn is conveyed through copper plating baths made up as follows: copper sulfate pentahydrate at 0.8-1.1 moles/liter; sulfuric acid at 3-4.5% by volume; hydrochloric acid to achieve a chloride concentration of 50-100 ppm chloride; and phosphoric acid at 1.7-2.0 ml/gallon. The rinse is DI water.

Step 5. Second functional layer and rinse. The yarn is conveyed through nickel plating baths which consist of a pre-formulated Barrett nickel sulfamate solution from MacDermid to which boric acid is added at 34-45 g/l. The rinse is DI water.

Step 6. Third functional layer and rinse. The yarn is conveyed through silver plating baths which consist of a pre-formulated proprietary solution of Cyless Silver II supplied by Technic. The rinse is DI water.

Testing. Electrical resistance tests (ohms/unit length) are performed by wrapping the metallized yarn around two probes set 12 inches apart and measuring the resistance with a Quad Tech 1800 ohmmeter; ten measurements are taken and averaged. Plated metal weight is determined by weighing a precisely cut 3 foot length of yarn in a Model AV-150 Ohaus gram balance, averaging three measurements and subtracting the basis weight of the yarn; the result is expressed as a percentage of the total yarn weight. Plated metal adhesion is empirically determined by lightly drawing a 3 foot length of metallized yarn three times over a smooth straight edge; the metal should not flake off and any change in resistance should not exceed 10%. Plated metal adhesion is also determined by cycling a sample of the yarn from 0 to 200° C. three times and measuring the change in its resistance which should not exceed 10%. Solderability is determined by applying 2-3 drops of Kester 951 flux to a test specimen wrapped around Teflon tubing, submerging the specimen in a pot of molten solder for several seconds, and visually inspecting for solder wetting and adhesion.

Example 1

A 600 foot length of yarn was processed in accordance with the preferred embodiment for a construction consisting of a first functional layer of copper followed by a second functional layer of nickel. The starting yarn was comprised of a single ply of 275 stainless steel (AISI 316L) monofilaments, each 12 microns in diameter with a Z direction twist of 100 turns/meter. The linear resistivity of this starting material was 9 ohms/ft (29.5 ohms/m) and its basis weight was 71.6 mg/ft (235 mg/m), yielding a resistance/weight of 126 ohms/g. This material was supplied by Bekaert and identified by code VN12/1×275/100 Z. The metallized yarn had an electrical resistance of 1.12 ohms/ft (3.7 ohms/m) and a metal weight of 93.4 mg/ft (306 mg/m), yielding a nominal resistance/weight of 12 ohms/gram. The plated metal had good adhesion to the stainless steel. Inspection of the yarn bundle under a microscope revealed that while 80-90% of the monofilaments were completely coated, the remaining filaments in the center of the yarn bundle were not, suggesting that a twist level of 100 turns/meter is a little too high to permit complete and substantially uniform coating of all of the monofilaments.

Example 2

A 600 foot length of yarn was processed in accordance with the preferred embodiment for a construction consisting of a first functional layer of copper followed by a second functional layer of nickel. The starting yarn was comprised of the same material as in the previous example except that the yarn in this example was untwisted. This material was supplied by Bekaert and identified by code VN12/1×275/no twist. This metallized yarn had an electrical resistance of 0.70 ohms/ft (2.3 ohms/m) and a metal weight of 124.0 mg/ft (407 mg/m), yielding a nominal resistance/weight of 5.6 ohms/gram. The plated metal had good adhesion to the stainless steel. Inspection of the yarn bundle under a microscope revealed that all of the monofilaments were substantially uniformly coated. By way of reference, #36 AWG copper wire has a basis weight of 34.4 mg/ft (113 mg/m) and a resistance/length of 0.43 ohms/ft (1.4 ohms/m), yielding a resistance/weight of 12.6 ohms/g.

Example 3

A 100 foot length of a single ply of VN12/1×275 with zero twist was processed for a non-electrical application calling for a first functional layer of Permalloy (80% nickel/20% iron). Microscope inspection of the yarn bundle confirmed that all of the monofilaments were substantially uniformly coated with this metal alloy.

The highly conductive metallized yarn materials of this invention can be advantageously used in applications other than braided or knitted cable shielding. The metallized monofilaments or yarn can, for example, be woven into flexible, lightweight fabrics suitable for protecting sensitive electronic equipment. The metallized monofilaments can be cut or chopped into staple fiber lengths and mixed with plastic molding compounds to incorporate RFI/EMI shielding into electronic equipment enclosures. The metallized monofilaments can also be incorporated into various shapes and forms and in non-woven fabrics and materials to suit particular purposes.

The plated stainless steel yarn of the invention can also be used in non-electrical applications, among which it is particularly well-suited to the requirements of a catalytic media. Catalysts are invaluable as accelerants in a wide variety of chemical reactions but their efficiency depends in large part on the rate at which the reaction products come in contact with the surfaces of the catalyst (which participates but is not consumed in the reaction). Indeed, the ideal disposition of a catalytic substance is essentially a "surface", i.e., a geometric configuration that provides the largest possible surface area with the least possible thickness, preferably sub-micron. When the catalysts in question are very expensive noble metals such as palladium, platinum, or rhodium, this configuration is also the most cost-effective disposition. However, in order to be useful, a catalyst in a surface-like configuration requires some means of mechanical support. In automotive catalytic converters, for example, the support consists of a ceramic honeycomb through which the exhaust gases pass and in the process react with the catalytic particles that are coated on the walls of the holes.

In light of these requirements, it may be seen that, when plated with a catalytic metal or metal alloy as prescribed in Step 4 of the Detailed Description, the metallized stainless steel yarn of the invention would take the form of a self-supporting catalytic media. In one embodiment, for example, a length of yarn metallized in that fashion would be loosely coiled or lightly compacted into a mass that would be inserted into a cartridge or canister to be incorporated into an automotive or truck exhaust system. Even a relatively short length of such yarn would make a high surface area-low weight catalytic media; to illustrate: a catalytic media formed from a 100 meter length of yarn comprised of 275 monofilaments each 12 microns in diameter and plated with 500 Angstroms of catalytic metal such as palladium would present a surface area of approximately 1 square meter, yet weigh less than 30 grams. Although this illustration involves a non-woven format, it will be appreciated that, depending on the application, the catalytic media incorporating the metallized yarn of the invention may take the form of a woven fabric or chopped fibers. These attributes suggest that, plated with appropriate catalytic metals or metal alloys, the metallized stainless steel yarns of the invention would also find advantageous use as catalytic media in membrane fuel cells, water purification systems, and chemical processes.

Accordingly the invention is not to be limited to what has been particularly shown and described and is to include the full spirit and scope of the appended claims.

What is claimed is:

1. An RFI/EMI shield material composed of a conductive multi-fiber comprising:
   a plurality of metallized monofilaments having a low twist,
   each monofilament including:
     a stainless steel micron diameter monofilament;
     a. an electroplated layer of copper deposited from a cyanide-copper or pyrophosphate copper solution, and completely and substantially uniformly electroplated on the stainless steel filament;
     b. an electroplated layer of a copper deposited from an acid copper solution and completely and substantially uniformly electroplated on the electroplated layer of copper specified in clause a;
     c. an electroplated layer of metal or metal alloy completely and substantially uniformly electroplated on the electroplated layer of copper specified in clause b and which is resistant to oxidation and corrosion or to which solder can bond;
     d. wherein the complete and substantially uniform electroplating of the layers specified in clauses a, b and c are produced by low tension transport of said multi-fiber through electroplating process stations; and
     e. wherein the twist in no more than 1 turn/inch.

2. The RFI/EMI shielding material of claim 1 wherein the layer in clause c electroplated on the electroplated layer in clause b is composed of a metal or metal alloy to which solder can bond.

3. The RFI/EMI shielding material of claim 1 wherein the layer in clause c electroplated on the electroplated layer in clause b is composed of a metal or metal alloy resistant to oxidation and corrosion.

4. The RFI/EMI shielding material of claim 1 wherein each of the monofilaments has:
   an additional layer electroplated on the layer in clause c of metal or metal alloy to which solder can bond.

5. The RFI/EMI shielding material of claim 1 wherein each of the monofilaments has:
   an additional electroplated layer of electroplatable metal or metal alloy electroplated on the electroplated layer specified in clause c.

6. The RFI/EMI shielding material of claim 1 wherein each of the monofilaments has:
   an additional electroplated layer electroplated on the electroplated layer specified in clause c and comprising a metal or metal alloy that is known to form a strong bond with a solderable metal.

7. The RFI/EMI shielding material of claim 6 wherein the additional layer of metal or metal alloy is chosen from the group consisting of silver, tin, tin alloy and gold.

8. The RFI/EMI shielding material of claim 1 wherein the electroplated layer specified in clause c is composed of a metal or metal alloy from the group consisting of nickel, tin, chromium, noble metal, and tin alloy.

9. The RFI/EMI shielding material of claim 1 wherein the layer specified in clause c comprises nickel.

10. An RFI/EMI shield material composed of a conductive multi-fiber comprising:
   a plurality of metallized monofilaments having a low twist, each monofilament including:
   a stainless steel micron diameter monofilament;
   a. an electroplated layer of copper deposited from a cyanide-copper or pyrophosphate copper solution, and completely and substantially uniformly electroplated on the stainless steel filament;
   b. an electroplated layer of a copper deposited from an acid copper solution and completely and substantially uniformly electroplated on the electroplated layer of copper specified in clause a;
   c. an electroplated layer of metal or metal alloy completely and substantially uniformly electroplated on the electroplated layer of copper specified in clause b and which is resistant to oxidation and corrosion or to which solder can bond;
   d. wherein the complete and substantially uniform electroplating of the layers specified in clauses a, b and c are produced by low tension transport of said multi-fiber through electroplating process stations; and
   e. wherein the plurality of metallized monofilaments are untwisted.

11. The RFI/EMI shielding material of claim 10 wherein the layer in clause c electroplated on the electroplated layer in clause b is composed of a metal or metal alloy to which solder can bond.

12. The RFI/EMI shielding material of claim 10 wherein the layer in clause c electroplated on the electroplated layer in clause b is composed of a metal or metal alloy resistant to oxidation and corrosion.

13. The RFI/EMI shielding material of claim 10 wherein each of the monofilaments has:
   an additional layer electroplated on the layer in clause c of metal or metal alloy to which solder can bond.

14. The RFI/EMI shielding material of claim 10 wherein each of the monofilaments has:
   an additional electroplated layer of electroplatable metal or metal alloy electroplated on the electroplated layer specified in clause c.

15. The RFI/EMI shielding material of claim 10 wherein each of the monofilaments has:
   an additional electroplated layer electroplated on the electroplated layer specified in clause c and comprising a metal or metal alloy that is known to form a strong bond with a solderable metal.

16. The RFI/EMI shielding material of claim 15 wherein the additional layer of metal or metal alloy is chosen from the group consisting of silver, tin, tin alloy and gold.

17. The RFI/EMI shielding material of claim 10 wherein the electroplated layer specified in clause c is composed of a metal or metal alloy from the group consisting of nickel, tin, chromium, noble metal, and tin alloy.

18. The RFI/EMI shielding material of claim 10 wherein the layer specified in clause c comprises nickel.

19. An RFI/EMI shield material composed of a conductive multi-fiber comprising:
   a plurality of metallized monofilaments having a low twist, each monofilament including:
   a. an electroplated layer of copper deposited from a cyanide copper or pyrophosphate-copper solution, and completely and substantially uniformly electroplated on the stainless steel monofilament;
   b. an electroplated layer of metal or metal alloy completely and substantially uniformly electroplated on the electroplated layer of copper specified in clause a and which is resistant to oxidation and corrosion or to which solder can bond;
   c. wherein the complete and substantially uniform electroplating of the layers specified in clauses a and b are produced by low tension transport of said multi-fiber through electroplating process stations; and
   d. wherein the twist is no more than 1 turn/inch.

20. The RFI/EMI shielding material of claim 19 wherein the layer in clause b electroplated on the electroplated layer specified in clause a is composed of a metal or metal alloy to which solder can bond.

21. The RFI/EMI shielding material of claim 19 wherein the layer in clause b electroplated on the electroplated layer specified in clause a is composed of a metal or metal alloy resistant to oxidation and corrosion.

22. The RFI/EMI shielding material of claim 19 wherein each of the monofilaments has:
   an additional layer electroplated on the layer in clause b of metal or metal alloy to which solder can bond.

23. The RFI/EMI shielding material of claim 19 wherein each of the monofilaments has:
   an additional electroplated layer of electroplatable metal or metal alloy electroplated on the electroplated layer specified in clause b.

24. The RFI/EMI shielding material of claim 22 wherein the additional layer of metal or metal alloy is chosen from the group consisting of silver, tin, tin alloy and gold.

25. The RFI/EMI shielding material of claim 19 wherein the electroplated layer specified in clause b is composed of a metal or metal alloy from the group consisting of nickel, tin, chromium, noble metal and tin alloy.

26. The RFI/EMI shielding material of claim 19 where the layer specified in clause b comprises nickel.

27. An RFI/EMI shield material composed of a conductive multi-fiber comprising:
   a plurality of metallized monofilaments having a low twist, each monofilament including:
   a. an electroplated layer of copper deposited from a cyanide copper or pyrophosphate-copper solution, and completely and substantially uniformly electroplated on the stainless steel monofilament;
   b. an electroplated layer of metal or metal alloy completely and substantially uniformly electroplated on the electroplated layer of copper specified in clause a and which is resistant to oxidation and corrosion or to which solder can bond;
   c. wherein the complete and substantially uniform electroplating of the layers specified in clauses a and b are produced by low tension transport of said multi-fiber through electroplating process stations; and
   d. wherein the plurality of metallized monofilaments are untwisted.

28. The RFI/EMI shielding material of claim 27 wherein the layer in clause b electroplated on the electroplated layer specified in clause a is composed of a metal or metal alloy to which solder can bond.

29. The RFI/EMI shielding material of claim 27 wherein the layer in clause b electroplated on the electroplated layer specified in clause a is composed of a metal or metal alloy resistant to oxidation and corrosion.

30. The RFI/EMI shielding material of claim 27 wherein each of the monofilaments has:
   an additional layer electroplated on the layer in clause b of metal or metal alloy to which solder can bond.

31. The RFI/EMI shielding material of claim 27 wherein each of the monofilaments has:

an additional electroplated layer of electroplatable metal or metal alloy electroplated on the electroplated layer specified in clause b.

32. The RFI/EMI shielding material of claim 30 wherein the additional layer of metal or metal alloy is chosen from the group consisting of silver, tin, tin alloy and gold.

33. The RFI/EMI shielding material of claim 27 wherein the electroplated layer specified in clause b is composed of a metal or metal alloy from the group consisting of nickel, tin, chromium, noble metal and tin alloy.

34. The RFI/EMI shielding material of claim 27 where the layer specified in clause b comprises nickel.

* * * * *